United States Patent [19]
Lee et al.

[11] Patent Number: 6,011,283
[45] Date of Patent: Jan. 4, 2000

[54] PILLAR EMITTER FOR BICMOS DEVICES

[75] Inventors: Steven Lee; Gayle Miller, both of Colorado Springs, Colo.

[73] Assignees: Hyundai Electronics America; NCR Corporation, both of Milpitas, Calif.

[21] Appl. No.: 07/962,544

[22] Filed: Oct. 19, 1992

[51] Int. Cl.$^7$ .......... H01L 29/80; H01L 31/112
[52] U.S. Cl. .......... 257/273; 257/205
[58] Field of Search .......... 257/205, 273

[56] References Cited

U.S. PATENT DOCUMENTS

| | | | |
|---|---|---|---|
| 4,521,952 | 6/1985 | Riseman | 29/590 |
| 4,691,436 | 9/1987 | Hirao | 437/33 |
| 4,703,554 | 11/1987 | Havemann | 437/31 |
| 4,705,599 | 11/1987 | Suda et al. | 156/653 |
| 4,745,080 | 5/1988 | Scovell et al. | 437/31 |
| 4,764,801 | 8/1988 | McLaughlin et al. | 257/588 |
| 4,839,305 | 6/1989 | Brighton | 437/41 |
| 4,868,135 | 9/1989 | Ogura et al. | 437/31 |
| 4,871,684 | 10/1989 | Glang et al. | 437/31 |
| 4,980,738 | 12/1990 | Welch et al. | 357/34 |
| 5,001,526 | 3/1991 | Gotou | 257/302 |
| 5,006,476 | 4/1991 | De Jong et al. | 437/31 |
| 5,055,419 | 10/1991 | Scovell et al. | 437/31 |
| 5,057,902 | 10/1991 | Haskell | 257/755 |
| 5,071,778 | 12/1991 | Solheim | 437/31 |
| 5,075,241 | 12/1991 | Spratt et al. | 437/31 |
| 5,098,854 | 3/1992 | Kapoor et al. | 437/31 |
| 5,162,885 | 11/1992 | Hunt et al. | 257/438 |
| 5,443,994 | 8/1995 | Solheim | 437/164 |

FOREIGN PATENT DOCUMENTS

0199061  3/1986  European Pat. Off. .

*Primary Examiner*—David Ostrowski
*Attorney, Agent, or Firm*—Townsend and Townsend and Crew LLP

[57] ABSTRACT

A monolithic semiconductor device includes a field effect transistor and a bipolar junction transistor with a pillar emitter structure. The pillar structure raises the BJT emitter above the surface of a trenched base. Ions implanted into the base trench diffuses into an extrinsic base contact region. The pillar elevation structure increases travel distance between the trench and the emitter and protects against encroachment without increasing the total emitter area allocated to the BJT device. A spacer oxide adjacent to the pillar separates the pillar from the trench-region implanted with ions.

6 Claims, 7 Drawing Sheets

PILLAR EMITTER FOR BICMOS DEVICES

BACKGROUND

The present invention relates to semiconductor processing and, in particular, to a process for forming a bipolar junction transistor emitter structure in BICMOS (Bipolar junction and Complementary Metal Oxide Silicon) integrated circuits.

Although the original development of the monolithic integrated circuit ("IC") was based upon bipolar junction transistor ("BJT") technology, much of the recent work has focussed on very large scale integrated ("VLSI") circuits that utilize metal-oxide-silicon field effect ("MOSFET") transistors. MOSFET devices may be constructed with n-channel transistors ("NMOS"), p-channel transistors ("PMOS") or may combine both n-channel and p-channel transistors in a complementary design ("CMOS").

The MOSFET devices, with their generally lower power dissipation and greater circuit densities, have come to dominate the logic and memory portions of the semiconductor market. Bipolar devices, however, have continued to be preferred in certain applications that require linear amplification of analog signals or maximum high frequency performance.

As can be appreciated, the limitations inherent in restricting a product to either MOSFET or BJT technologies at times forced circuit and device designers to compromise device or system performance. Thus, for some applications, the design requirements could best be met by combining both CMOS and BJT technologies in the same monolithic structure ("BiCMOS").

The need for a combination of both CMOS and BJT technologies has led to the development of a series of hybrid process flows that can produce the desired monolithic structure. However, in order to encompass production of the various elements of both CMOS and BJT structures, the first processes were more complex and demanding and frequently achieved lower circuit densities than either technology singly. Subsequent efforts in the BiCMOS process field have sought to reduce the complexity and/or improve the performance of first processes through elimination of masking levels, utilization of common elements, and other processing modifications.

It is known that the use of polysilicon emitter structures can improve device performance by reducing base saturation currents, $j_{Dsat}$, and increasing the device gain, $h_{fe}$. As device sizing decreases however, encroachment from the extrinsic base regions limit the effective area available for collector current injection. Extrinsic base region encroachment can offset the benefits associated with polysilicon emitters by reducing the current gain, lowering the cutoff frequency, and degrading device reliability.

An objective of the present invention is the production of an improved bipolar junction structure by effecting, through the disclosed method, an increased physical separation of the oppositely doped regions present in the structure without requiring a corresponding increase in the device surface area.

A further object of the present invention is the use of the improved bipolar junction structure as an emitter structure in the production of an improved bipolar junction transistor exhibiting desirable electrical parameters yet being less sensitive to process variation than existing devices.

A further object of the present invention is the production of an improved bipolar junction transistor which is especially resistant the degradation in electrical performance associated with dopant encroachment into the base region.

A further object of the present invention is the production of an improved bipolar junction transistor emitter structure in which a portion of the base adjacent to the emitter is removed after the deposition of the emitter polysilicon to form a "pillar" structure that reduces sensitivity to process variations.

A further object of the present invention is the use of the improved bipolar junction transistor in the production of an improved BICMOS device through integration of BJT and CMOS processes, thereby allowing the benefits of the combination of BJT and CMOS structures in a single monolithic structure as well as the BJT performance improvements provided by the present invention.

SUMMARY

In the preferred embodiment, a PMOS field effect transistor and an NPN transistor each will be formed in respective N-wells with underlying N+ buried layers. An NMOS field effect transistor will be formed in a P-well. The NPN transistor will use the N-well as a collector with p-type dopant implanted into the N-well to form an intrinsic base region. A polysilicon emitter is applied to the base. A region around the base is trenched to lower the surface and leave the emitter separated from the base by a pillar structure. A spacer oxide is applied to the sidewalls of the emitter and pillar structure. Additional dopant implanted into the trenched base forms an extrinsic base contact region separated from the pillar by a region protected by the spacer. When the implanted structure is annealed, ions from the extrinsic base diffuse, potentially encroaching into the intrinsic base region and degrading device performance. The spacer and pillar structure, by increasing the physical separation of the extrinsic region and the emitter, protects against this encroachment.

DETAILED DESCRIPTION OF PREFERRED EMBODIMENTS

A BiCMOS circuit includes MOS and BJT devices. Devices may be positioned and interconnected in limitless ways on a monolithic structure to achieve the functions of the ultimate circuit application. The methods and structures of this invention are explained by showing the evolution of individual NMOS, PMOS and BJT devices during a fabrication process. It should be understood that this explanation is sufficient to enable persons of ordinary skill to fabricate monolithic circuits populated with many such devices as required for different applications. The absolute device dimensions, various circuit design criteria, doping methods, dopant concentrations, implantation conditions, and other process parameters may be varied to achieve devices with varying functions and performance levels. Values disclosed here are illustrative, but they are not absolute limits on the invention.

An object of the present invention is to obtain a single monolithic circuit structure which includes both CMOS devices and an elevated emitter BJT device with reduced sensitivity to extrinsic base region encroachment.

A further object of the invention is to obtain a single monolithic circuit structure with improved performance and reliability and also with enhanced manufacturability. The above objective is achieved using the following fabrication approach.

Buried Layer and Well Formation:

In the preferred embodiment, an NMOS device will be formed in a P-well. A PMOS device and an NPN transistor each will be formed in respective N-wells with underlying N+ buried layers. A circuit designer may choose to add a buried layer under the P-well or omit the buried layers under the N-wells while still taking advantage of the other methods and structures described below.

One method for preparing device regions begins with single crystal p-type silicon wafer, having <100> crystallographic orientation and a resistivity of 5–30 Ω-cm. Coating this wafer with a photoresist and patterning allows ion implantation of an n-type dopant, typically arsenic, As, $1.0 \times 10^{15}$–$4.0 \times 10^{16}$ atoms/cm$^2$ at 30–150 KeV, to form N+ buried layers. The photoresist exposes the regions which ultimately will underlie the N-wells (BJT and PMOS devices). Arsenic, As, or antimony, Sb, may be used as the n-type dopant. P+ buried layers could be formed under the P-wells in a similar fashion utilizing a separate photolithographic step and a p-type dopant implant.

After photoresist removal, an n-type epitaxial ("epi") layer, typically 1.0–3.0 $\mu$m, with 5–30 Ω-cm resistivity, is grown on the wafer, covering both the N+ buried layers and the remaining P− areas of the original substrate. The result is a structure as shown in FIG. 1.

Figure 1:
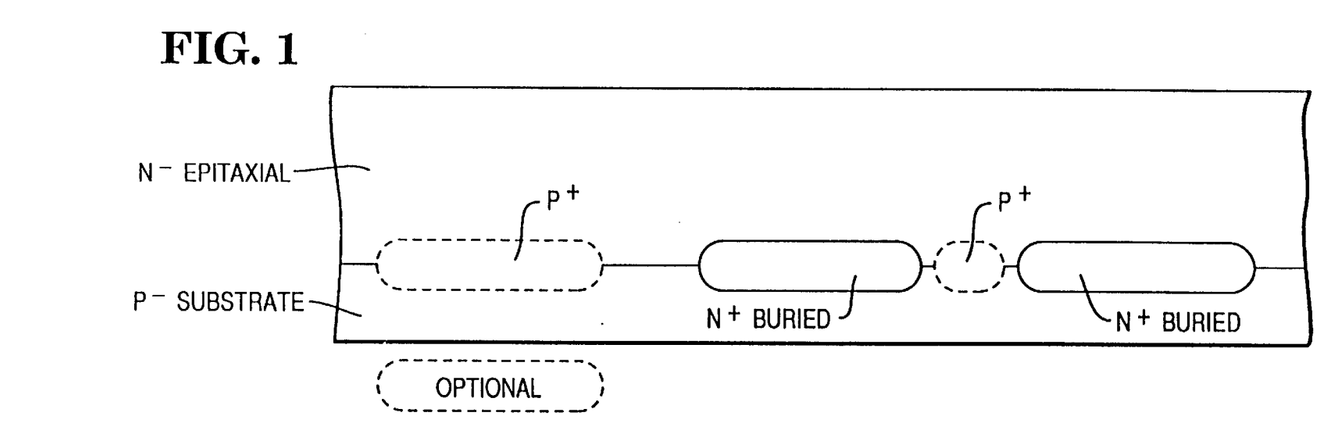
FIG. 1 is a three-device cross section showing buried N-layers for BJT and PMOS devices resulting from ion implantation and an epitaxial layer grown on a substrate.
Figure 2:
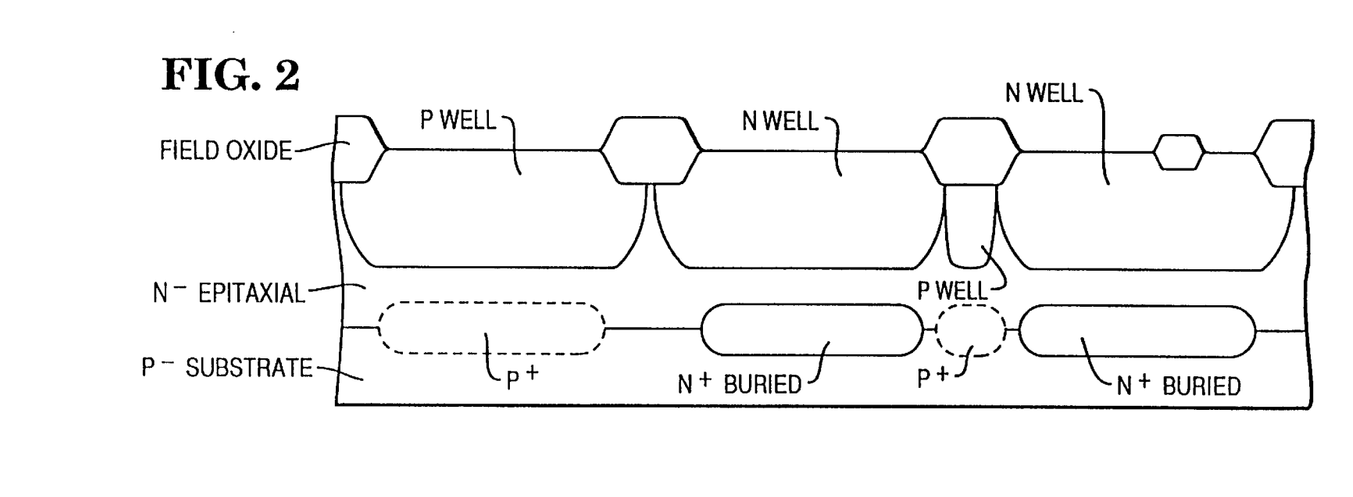
FIG. 2 is a three-device cross section showing wells for PMOS, NMOS and BJT devices, a deep collector and field oxides separating active regions after annealing.

FIG. 2 illustrates a three device cross section similar to FIG. 1 with additional P and N-wells and an optional deep collector. To fabricate this structure from the structure of FIG. 1, the wafer is coated with photoresist and patterned to expose the active areas for PMOS and BJT devices. Implantation dopes these active areas with phosphorus, $1.0 \times 10^{11}$–$8.0 \times 10^{13}$ atoms/cm$^2$, 30–150 KeV, or another n-type dopant. In PMOS areas, the n-type dopant sets the N-well doping. In the BJT regions the n-type dopant sets the collector doping.

After removing the N-well pattern, the wafer is coated with photoresist and patterned to expose the active area for NMOS device. Implantation dopes this active area with boron, B$^{11}$, $1.0 \times 10^{11}$–$8.0 \times 10^{13}$ atoms/cm$^2$, 20–100 KeV, or another p-type dopant. In NMOS areas the p-type dopant sets the P-well doping. Although this explanation has described the implantation of the N-wells first, it should be understood that the P-wells and the N-wells may be implanted in either order.

It should also be understood that adjacent wells of the same dopant type may be more effectively isolated from one another by interspersing a region of the alternate dopant type. In the preferred embodiment this isolation is accomplished with a well implant mask that creates the region of alternate dopant type at the same time the alternate dopant type well is created. Similar isolation results may be achieved with one or more additional patterning and implant steps. FIG. 2 illustrates a p-type region having a P-well doping level formed between two adjacent N-wells. Similarly, n-type regions having an N-well doping level could be formed between adjacent P-wells during the N-well implant. If desired, after the well implant, the structure can be heated to drive the dopant deeper.

The NPN transistor will use the N-well as a collector and may optionally use a deep collector. After removing the photoresist remaining after doping the wells, the wafer is coated again with photoresist and patterned to expose a deep collector region in the BJT N-well. Implantation increases the n-type dopant in the deep collector region.

After removing the deep collector contact pattern (if used), a thermal drive-in step, 1000–1150° C., 0.5–10 hours, diffuses the N-well, P-well, and deep collector implants to a depth of 0.05–1.5 $\mu$m.

A layer of silicon dioxide ("oxide") 0.01–0.1 $\mu$m thick is formed on the wafer. A layer of silicon nitride ("nitride"), 0.05–0.3 $\mu$m thick, is then deposited on the oxide layer. The wafer is then coated with photoresist and patterned to protect the active device areas. The wafer is then etched to remove the nitride and oxide from the non-active "field" regions of the wafer. Depending on the process tolerances and requirements, a plasma etch or etches, a series of wet etches, or a combination of plasma and wet etches, may be selected to remove the nitride and oxide layers.

After photoresist removal, the wafer is subjected to a long oxidation cycle during which field oxide layer, 0.3–1.2 $\mu$m, is formed. Removal of the oxide and nitride that protected the active device areas exposes the n-type epi layer and results in a structure having a cross section as shown in FIG. 2.

Gate Oxide/Intrinsic Base Implant

A thin thermal oxide layer, 0.005–0.05 $\mu$m, the "gate" oxide, is then grown in both the CMOS and BJT regions.

Figure 3:
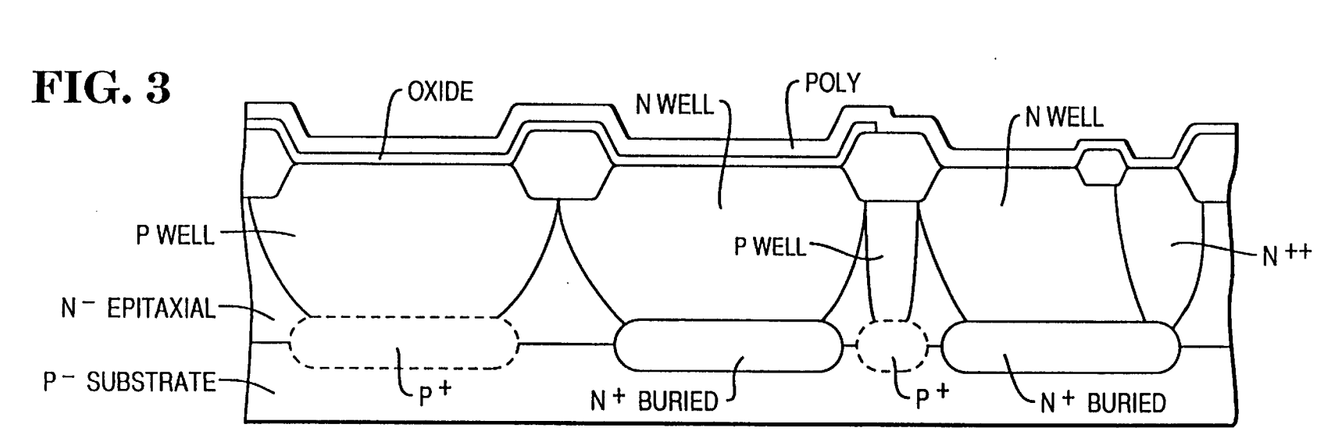
FIG. 3 is a three-device cross section showing a deep collector and an intrinsic base region for the BJT device resulting from ion implantation steps and annealing steps.

The wafer is coated with photoresist and patterned to expose the BJT device region. After etching the wafer to remove the gate oxide layer from the BJT regions, the photoresist is removed. A thin polysilicon masking layer, 0.02–0.2 $\mu$m, is deposited over the entire wafer. This polysilicon masking layer protects the CMOS gate area during subsequent processing. The masking layer also allows additional control of the intrinsic base implant in the BJT region by reducing boron implant channeling, and by optimizing the dopant profile. The result is shown in FIG. 3.

Throughout this disclosure, the term "intrinsic" is used in reference to relatively lightly doped semiconductor regions rather than regions which are completely undoped. Similarly, the term "extrinsic" is used in reference to semiconductor regions that are doped more heavily than the corresponding "intrinsic" regions. Used in this manner, neither term is intended to limit the absolute doping levels of the respective regions but should be used merely to distinguish the relative doping levels. The absolute doping levels of the specified regions may be tailored to produce devices which, although they share a common structure, possess distinct electrical parameters.

Figure 4:
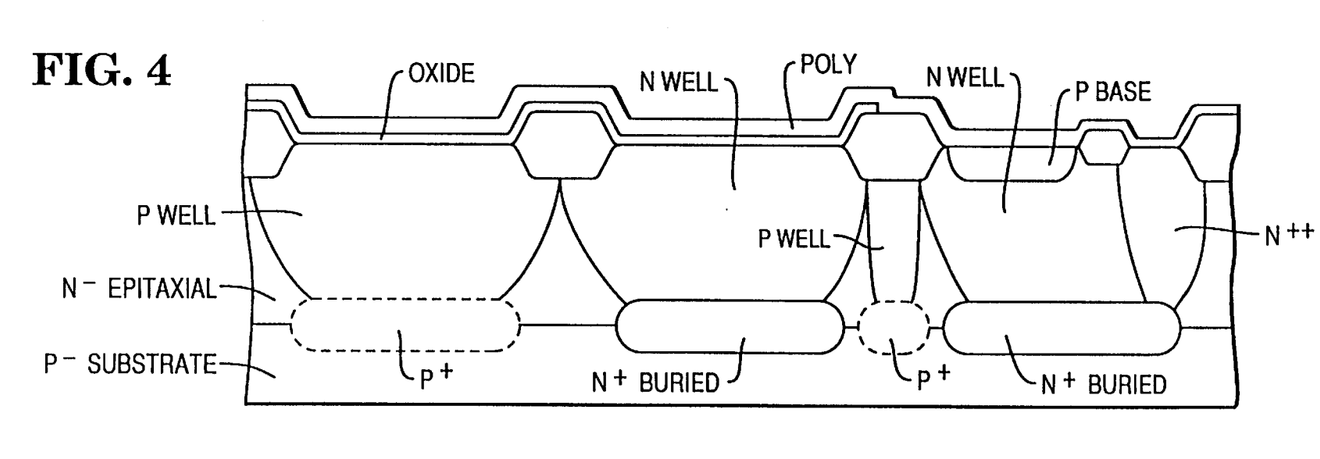
FIG. 4 is a three-device cross section showing a gate oxide layer over the MOS device regions after a growth step and a thin polysilicon layer over the BJT device regions following deposition and implantation.

After the poly deposition, the wafer is coated with photoresist and patterned to expose the base region. Depending on the implant species and the implant energy, the polysilicon may be removed prior to implant in order to achieve the necessary doping levels. Implantation of a p-type dopant, $B^{11}$ or $BF_2$, $3.0 \times 10^{11}$–$1.0 \times 10^{14}$ atoms/cm$^2$, 5–100 KeV, offsets the N-well doping concentration and creates an intrinsic p-type base region. The result is shown in FIG. 4. The wafer is then etched, using the same photoresist pattern, to remove both the thin polysilicon layer (if not removed prior to implant) and the oxide layer present in the base region to thereby expose the underlying epi layer.

Figure 5:
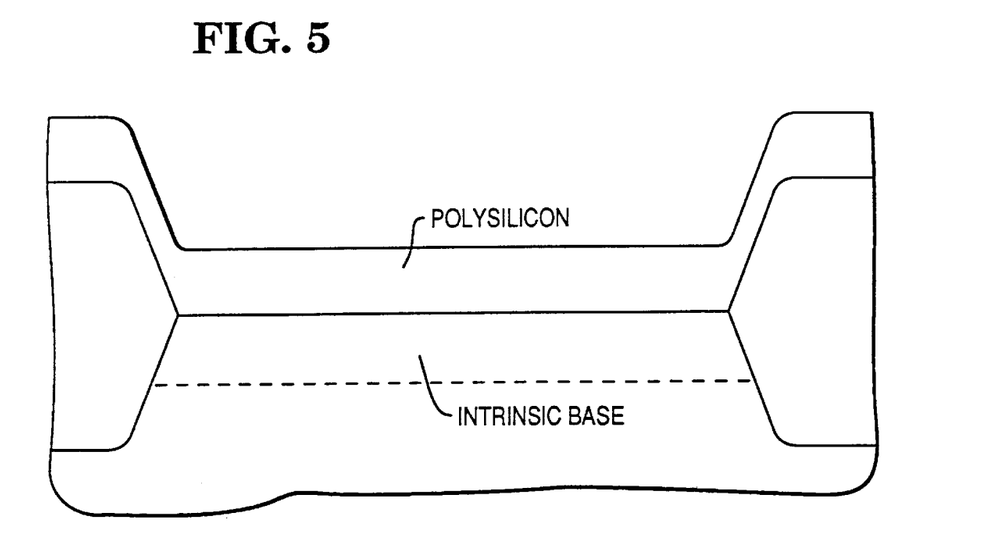
FIG. 5 is a detail cross section of the BJT emitter region of FIG. 4 showing a thin polysilicon layer over the intrinsic base region.
Figure 6:
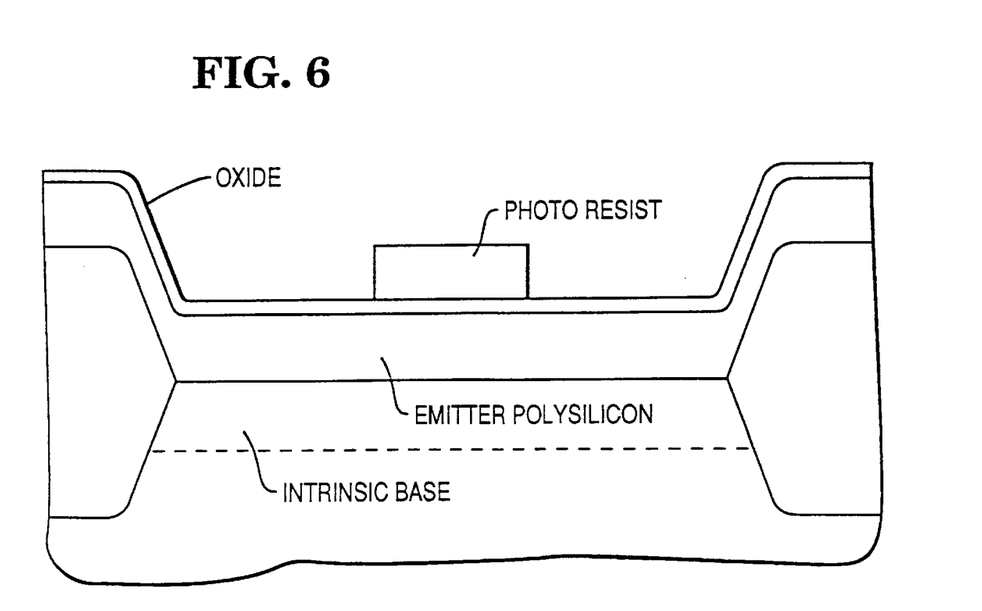
FIG. 6 is a detail cross section of the BJT emitter region showing an oxide layer and photoresist over a thin polysilicon layer prior to etching.

Emitter and Gate Formation:

After removing any remaining photoresist after etching the polysilicon and oxide layers, a layer of polysilicon, 0.15–0.50 μm, is deposited on the wafer. FIG. 5 shows a detail cross section of the base region at this point in the process. Gate areas will be similar but with an additional oxide layer already in place below the polysilicon. The wafer is then implanted with an n-type dopant, typically arsenic, $As^{75}$, $5.0 \times 10^{14}$–$5.0 \times 10^{16}$ atoms/cm$^2$, 30–150 KeV, thereby doping both the CMOS gates and the BJT emitter to reduce the resistivity of the deposited polysilicon. For improved photolithography processing, an optional thin oxide layer, 0.01–0.1 μm, may be formed on the polysilicon layer before patterning. The wafer is coated with photoresist and patterned to protect gate and emitter areas as shown in FIG. 6.

Base Trenching

Figure 7:
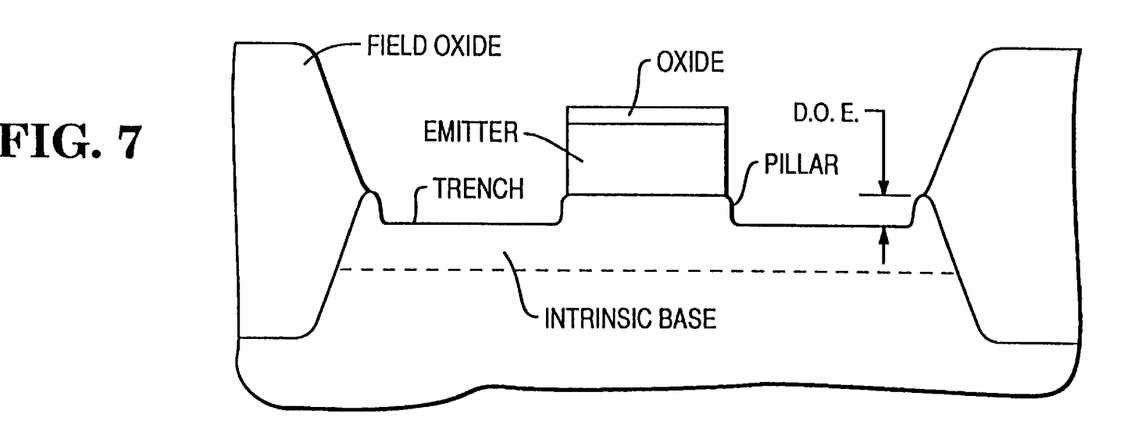
FIG. 7 is a detail cross section of the BJT emitter region showing a trench surrounding a pillar structure after a careful over-etch.
Figure 8:
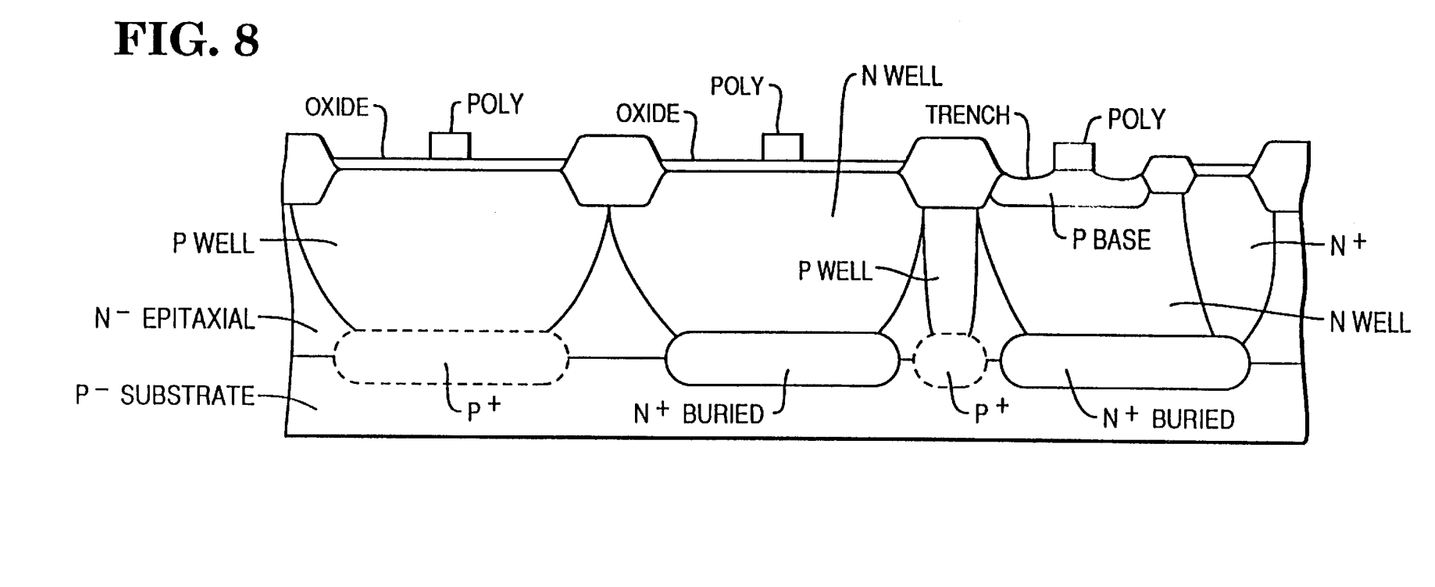
FIG. 8 is a three device cross section showing MOS and BJT device regions after a careful over-etch step.

In a process step significantly related to production of the unique emitter structure of the present invention, the patterned wafer is etched to form the CMOS gate and BJT emitter structures. The etch selectivity, at least 5:1 poly to oxide, is such that the gate oxide present in the CMOS regions prevents removal of any of the underlying epi layer in those regions. However, given the lack of an oxide interface between the poly and the epi in the BJT base region, the BJT region epi will be exposed to the etch when the polysilicon layer is removed. As a result, the etch process removes a portion of the intrinsic base around the emitter, thereby forming a trench and pillar as shown in FIG. 7. The depth to which the intrinsic base may be safely removed will be a function of etch uniformity and the desired device performance, in the preferred embodiment it is contemplated that the etch depth will typically range from 30–90% of the total pre-etch base depth. FIG. 8 shows a three device cross section illustrating trenching in the BJT base region but not around the MOS gate structures.

Spacer Oxide Formation

In some instances, it may be desirable to modify the doping profile of the CMOS gate regions through the use of a lightly doped drain ("LDD") in conjunction with formation of the oxide spacer. Although a LDD process could be incorporated into the present process, thereby increasing resistance to problems associated with hot carrier injection, such a process is optional and should not be seen as a restriction on the present invention.

Figure 9:
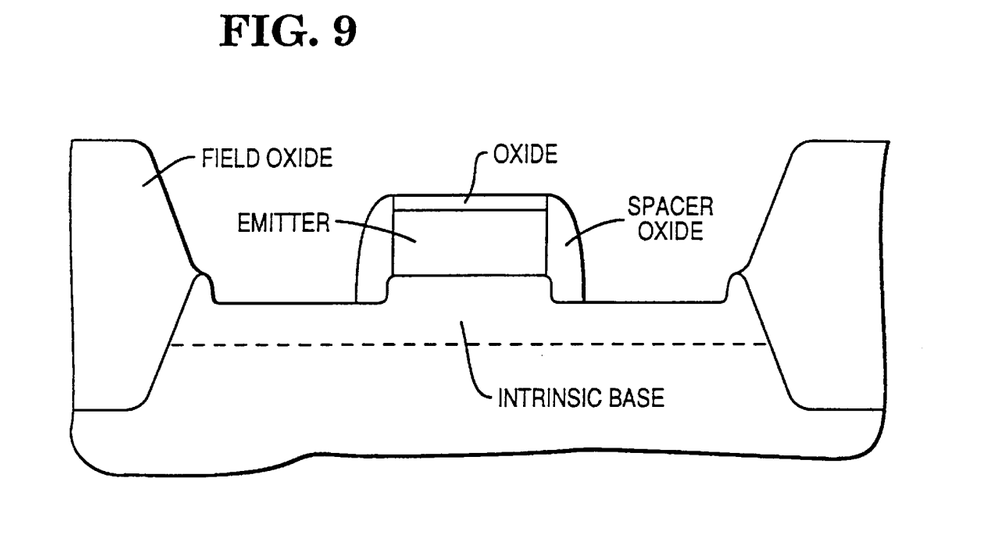
FIG. 9 is a detail cross section of the BJT emitter region showing a spacer oxide after growth and etch steps.

After removing the photoresist, a layer of oxide is formed on the wafer. This oxide layer is partially removed to form spacer oxide structures adjacent to both the CMOS gate and BJT emitter structures. FIG. 9 shows a detail of the spacer oxide around the BJT emitter. Gate areas will be similar but with an additional oxide layer already in place below the polysilicon.

Source, Drain, Base and Collector Contacts

The wafer is then coated with photoresist and patterned to expose both the PMOS source and drain ("S/D") regions and the BJT base contact regions. The wafer is then implanted with a p-type dopant, $B^{11}$ or $BF_2$, $1.0 \times 10^{15}$–$3.0 \times 10^{16}$ atoms/cm$^2$, 5–80 KeV, thereby forming the PMOS S/D regions and the BJT base contact regions.

After removing photoresist remaining after implantation, the wafer is coated with photoresist and patterned to expose the NMOS S/D, the emitter contact, and the collector contact regions. Implanting an n-type dopant, $As^{75}$, $1.0 \times 10^{15}$–$3.0 \times 10^{16}$ atoms/cm$^2$, 30–150 KeV, forms the NMOS S/D, the emitter contact, and the collector contact regions.

Figure 10:
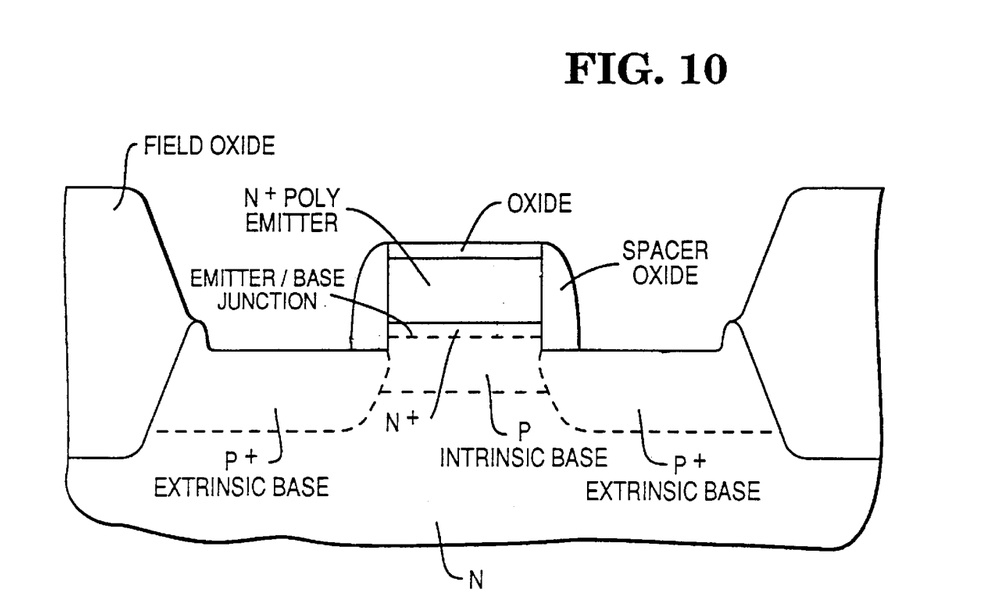
FIG. 10 is a detail cross section of the BJT emitter region showing emitter separated from encroachment after implantation and annealing of extrinsic base contacts.

After removal of the remaining photoresist, the wafer is subjected to a thermal anneal cycle, 900–950° C., 30–90 minutes, to anneal the implant damage. It is possible to minimize the diffusion during this anneal cycle by utilizing rapid thermal processing (RTP) techniques. A RTP anneal step at 1000–1100° C. for 5–150 seconds can anneal the implant damage while maintaining much shallower junctions than those possible with traditional furnace annealing. FIG. 10 shows the BJT emitter region after annealing. The p-type dopant diffuses to form an extrinsic base region. It will be appreciated that the spacer oxide and the emitter pillar structure increase the travel distance between the point of implantation and the emitter. This increased travel distance protects the emitter region from dopant encroachment from adjacent extrinsically doped regions. While the invention has been illustrated to show the dopant diffusing into the pillar structure, benefits of the invention will be realized even if dopant approaches, but does not enter, the pillar structure.

Figure 11:
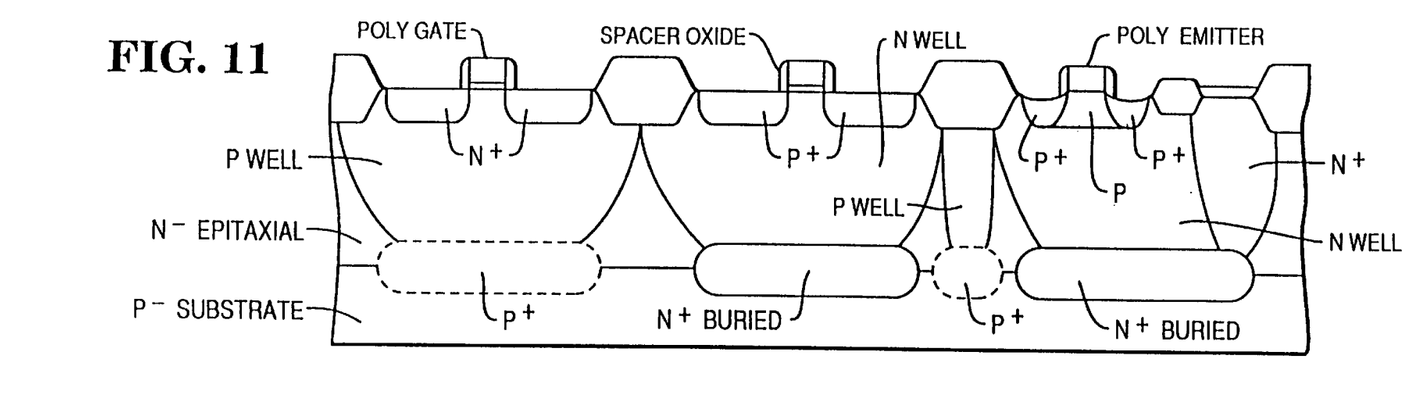
FIG. 11 is a three-device cross section showing spacer oxides, CMOS source/drain regions, and BJT device extrinsic contact regions.

FIG. 11 shows a three device cross section with source and drain regions. Although this explanation has described the implantation of the contact regions after trenching, it should be understood that implantation might be completed before trenching, and resulting device would still benefit from the pillar structure as described above.

BPSG Deposition and Metal Contact Application

The remaining steps of the process are not unique to the present invention but may be used to produce a functional device with multiple layers of metallic interconnection and a passivation layer.

A layer of borophosphosilicate glass ("BPSG"), 0.6–1.0 μm, is deposited on the wafer to form a dielectric above the doped polysilicon. The layer of BPSG is then subjected to a thermal "reflow" process 800–950° C., 10–90 minutes, to improve wafer planarization. The wafer then is coated with photoresist and patterned to expose openings to the CMOS S/D, CMOS gate, BJT emitter, BJT base contact, and BJT collector contact regions. Etching removes the BPSG from the contact openings.

Figure 12:
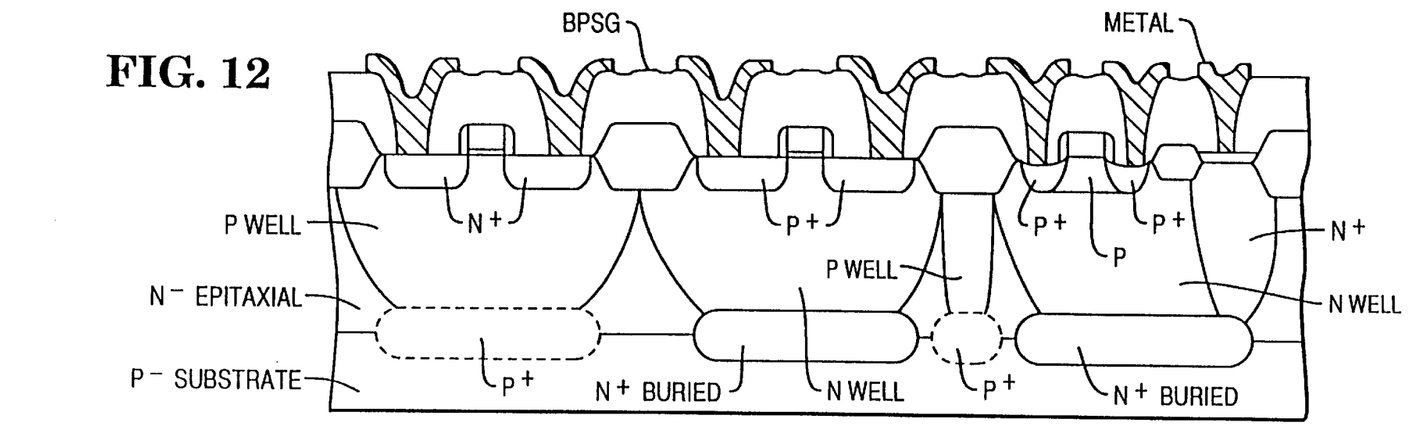
FIG. 12 is a three-device cross section showing a dielectric layer etched to expose contact regions and metal contacts to source, drain, base and collector regions.
Figure 13:
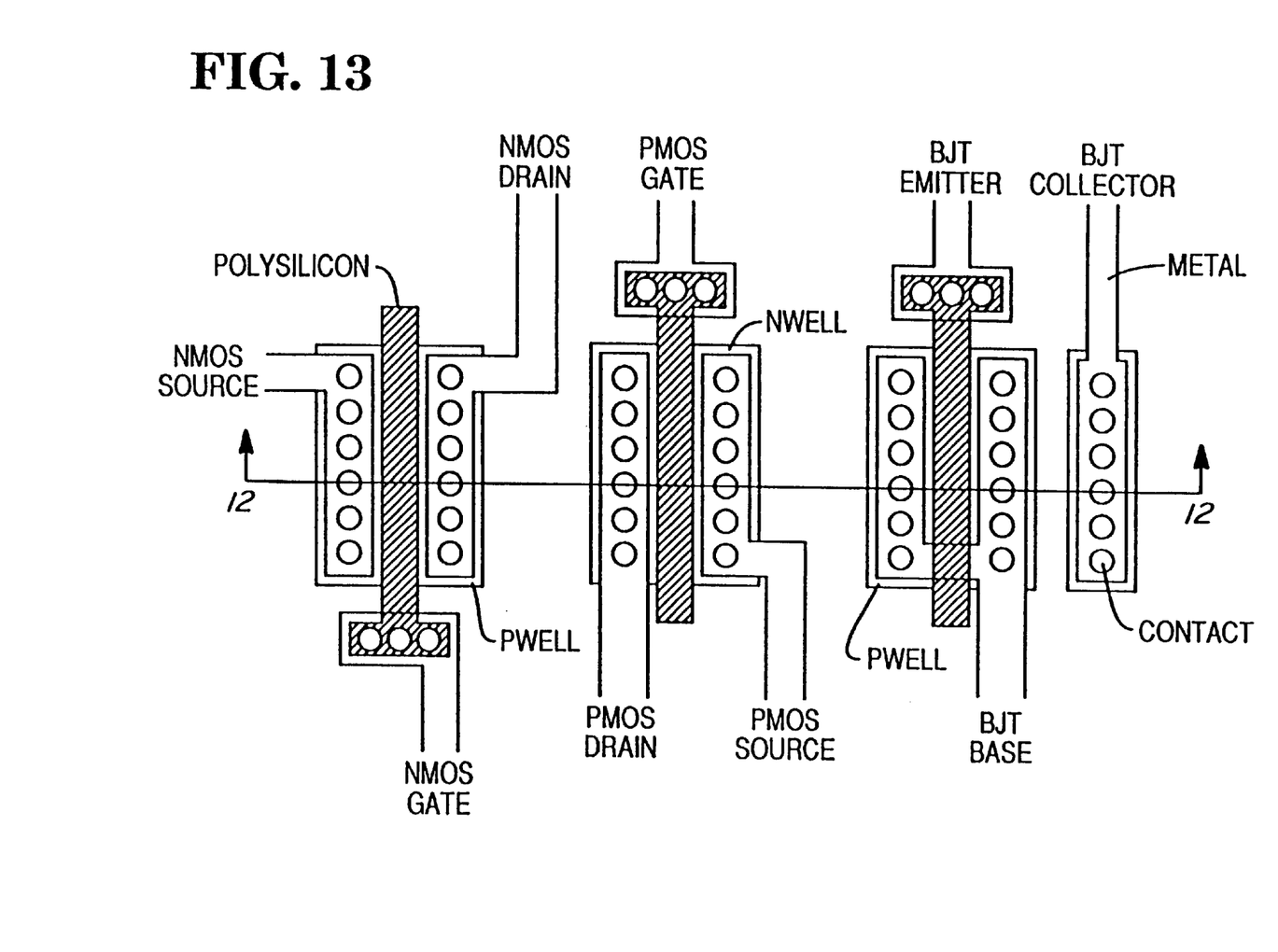
FIG. 13 is a top view of the three-device structure of FIG. 12 showing the contact regions and metal leads of the CMOS and BJT devices with the cross section of FIG. 12 indicated by the line A—A'.

After removing photoresist remaining after the etching process, a first layer of metal, typically an Al—Si—Cu alloy, 0.5–1.2 μm, is formed on the wafer using sputter deposition. The wafer is coated with photoresist and patterned to protect a first level of metal leads. The wafer is then etched to remove that portion of the metal not protected by the photoresist pattern, leaving a structure as shown in FIG. 12.

After removing photoresist remaining after the etching step, a layer of oxide, 0.6–1.5 μm, is deposited on the wafer. The wafer is coated with photoresist and patterned to expose a first level of via openings to the first metal layer. Etching removes the oxide from the defined first level via openings.

Additional metal layers may be added as required using known techniques. It is contemplated that three layers would provide adequate interconnection for many applications.

A passivation layer of nitride, oxynitride, or a compound layer of phosphorus doped oxide and nitride, 0.5–2.0 μm, is formed on the wafer. The wafer is then sintered in a forming gas ambient at 380–450° C. for 30–90 minutes to form an alloy at the contact metal/silicon interface, thereby providing good electrical connection between the metal and the silicon substrate. The wafer is then coated with photoresist and patterned to define wire bonding openings in the passivation layer. The wafer is then etched to remove the exposed passivation material.

After removal of the remaining photoresist the wafer is ready for pre-assembly testing.

What is claimed is:

1. A monolithic semiconductor device having a field effect transistor and a bipolar junction transistor, the bipolar junction transistor further comprising:
   a collector of a first dopant type;
   a base having an intrinsic concentration of a second dopant type and forming a first PN junction with the collector, the base including (i) an extrinsic contact region characterized by a concentration of the second dopant which is greater than the intrinsic concentration and (ii) a trenched surface;
   a pillar structure, comprising the second dopant type, extending from the base and away from the trenched surface;
   an emitter of the first dopant type connected to the pillar structure at a surface displaced from the base, the emitter forming a PN junction with the pillar structure.

2. A device as in claim 1 further comprising a spacer adjacent to the pillar structure and emitter.

3. A bipolar PN junction device comprising:
   a first semiconductor containing an intrinsic concentration of a first dopant type, the first semiconductor also including (i) a trenched extrinsic contact region characterized by a concentration of the first dopant type which is greater than the intrinsic concentration and (ii) a partially trenched surface;
   a pillar structure of the first dopant type overlying a non-trenched portion of the first semiconductor; and
   a second semiconductor of a second dopant type connected to the pillar structure and forming a PN junction at a surface displaced from the extrinsic contact region.

4. A device as in claim 3 further comprising a spacer adjacent to emitter and the pillar structure and overlying the extrinsic contact region.

5. In an integrated circuit device comprising;
   a semiconductor of a first dopant type having a surface and a pillar extending away from said surface; and
   a semiconductor of a second dopant type connected to said pillar;
   wherein the concentration of said first dopant type is least in said pillar; and
   wherein said semiconductor of said first dopant type has an annular trench formed therein, said trench having a bottom and interior and exterior walls, and said surface is defined by said bottom and said pillar is defined by said interior wall.

6. The device of claim 5, wherein said pillar has sidewalls, further comprising;
   an insulating spacer covering said sidewalls.

* * * * *